United States Patent
Tsuchiya et al.

(10) Patent No.: US 8,472,150 B2
(45) Date of Patent: Jun. 25, 2013

(54) MAGNETO-RESISTIVE EFFECT DEVICE AND MAGNETIC DISK SYSTEM

(75) Inventors: Yoshihiro Tsuchiya, Tokyo (JP); Tomohito Mizuno, Tokyo (JP); Kei Hirata, Tokyo (JP); Koji Shimazawa, Tokyo (JP); Shinji Hara, Tokyo (JP)

(73) Assignee: TDK Corporation, Tokyo (JP)

( * ) Notice: Subject to any disclaimer, the term of this patent is extended or adjusted under 35 U.S.C. 154(b) by 1035 days.

(21) Appl. No.: 11/968,911

(22) Filed: Jan. 3, 2008

(65) Prior Publication Data

US 2008/0170336 A1    Jul. 17, 2008

(30) Foreign Application Priority Data

Jan. 17, 2007   (JP) ................................. 2007-007984

(51) Int. Cl.
*G11B 5/33*   (2006.01)

(52) U.S. Cl.
USPC .................. 360/324.1; 360/324; 360/324.11; 360/324.12; 360/324.2

(58) Field of Classification Search
USPC .......... 360/324.1, 324, 324.11, 324.2, 324.12
See application file for complete search history.

(56) References Cited

U.S. PATENT DOCUMENTS

| | | | |
|---|---|---|---|
| 7,218,483 B2 | 5/2007 | Yuasa et al. | |
| 2003/0161079 A1* | 8/2003 | Takahashi et al. | 360/324.11 |
| 2004/0021990 A1* | 2/2004 | Koui et al. | 360/324.1 |
| 2004/0234823 A1* | 11/2004 | Burgener et al. | 428/700 |
| 2008/0278864 A1* | 11/2008 | Zhang et al. | 360/324.12 |

FOREIGN PATENT DOCUMENTS

| | | |
|---|---|---|
| JP | 2003-8102 | 1/2003 |
| JP | 2003-298143 | 10/2003 |

OTHER PUBLICATIONS

Chugh et al., Epitaxial ZnO/Pt Layered Structures and ZnO-Pt Nanodot Composites on Sapphire (0001), Nov. 1, 2005, Journal of Electronic Materials, vol. 35, No. 5, 2006, pp. 840-845.*
Peiteado et al., Microstructural development of tin-doped ZnO bulk ceramics, Aug. 1, 2005, Materials Chemistry and Physics 101 (2007) 1-6, pp. 1-6.*
Ivill et al., Magnetization dependence on electron density in epitaxial ZnO thin films codoped with Mn and Sn, Sep. 3, 2004, Journal of Applied Physics 97, 053904 (2005), pp. 053904-1-053904-5.*
U.S. Appl. No. 12/014,575, filed Jan. 15, 2008, Chou, et al.
U.S. Appl. No. 12/022,538, filed Jan. 30, 2008, Chou, et al.
U.S. Appl. No. 11/946,358, Nov. 28, 2007, Shimazawa, et al.
U.S. Appl. No. 11/943, 171, filed Nov. 20, 2007, Hara, et al.

(Continued)

*Primary Examiner* — Hoa T Nguyen
*Assistant Examiner* — Carlos E Garcia
(74) *Attorney, Agent, or Firm* — Oblon, Spivak, McClelland, Maier & Neustadt, L.L.P.

(57) ABSTRACT

A giant magneto-resistive effect device (CPP-GMR device) having the CPP (current perpendicular to plane) structure comprising a spacer layer, and a first ferromagnetic layer and a second ferromagnetic layer stacked one upon another with the spacer layer interposed between them, with a sense current applied in a stacking direction, wherein the spacer layer comprises a first nonmagnetic metal layer and a second nonmagnetic metal layer, each made of a nonmagnetic metal material, and a semiconductor oxide layer interposed between the first nonmagnetic metal layer and the second nonmagnetic metal layer, the semiconductor oxide layer that forms a part of the spacer layer contains zinc oxide as its main component wherein the main component zinc oxide contains an additive metal, and the additive metal is less likely to be oxidized than zinc.

15 Claims, 6 Drawing Sheets

OTHER PUBLICATIONS

U.S. Appl. No. 11/934,979, filed Nov. 5, 2007, Mizuno, et al.
U.S. Appl. No. 11/931,219, filed Oct. 31, 2007, Shimazawa, et al.
U.S. Appl. No. 11/870,097, filed Oct. 10, 2007, Shimazawa, et al.
U.S. Appl. No. 11/865,384, filed Oct. 1, 2007, Hara, et al.
U.S. Appl. No. 11/856,438, filed Sep. 17, 2007, Shimazawa, et al.
U.S. Appl. No. 11/757,435, filed Jun. 26, 2007, Tsuchiya, et al.
U.S. Appl. No. 11/762,457, filed Jun. 13, 2007, Mizuno, et al.
U.S. Appl. No. 11/757,174, filed Jun. 1, 2007, Tsuchiya, et al.
U.S. Appl. No. 11/626,562, filed Jun. 24, 2007, Hara, et al.
U.S. Appl. No. 12/128,352, filed May 28, 2008, Mizuno, et al.
U.S. Appl. No. 12/112,598, filed Apr. 3, 2008, Hara, et al.

* cited by examiner

MAGNETO-RESISTIVE EFFECT DEVICE AND MAGNETIC DISK SYSTEM

BACKGROUND OF THE INVENTION

1. Field of the Invention

The present invention relates to a magneto-resistive effect device for reading the magnetic field strength of a magnetic recording medium or the like as signals, a thin-film magnetic head comprising that magneto-resistive effect device, and a head gimbal assembly and a magnetic disk system comprising that thin-film magnetic head.

2. Explanation of the Prior Art

With recent improvements in the plane recording density of magnetic disk systems, there have been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often referred to as the MR (magneto-resistive) device for short) and a recording head having a write-only induction type magnetic device are stacked on a substrate.

For the MR device, there is the mention of an AMR device harnessing an anisotropic magneto-resistive effect, a GMR device tapping a giant magneto-resistive effect, a TMR device making use of a tunnel-type magneto-resistive effect, and so on.

The reproducing head is required to have high sensitivity and high outputs in particular. GMR heads using a spin valve type GMR device have already been mass-produced as a reproduction head possessing such performances, and to meet further improvements in plane recording densities, reproducing heads using TMR devices are now being mass-produced, too.

In general, the spin valve type GMR device comprises a nonmagnetic layer, a free layer formed on one surface of that nonmagnetic layer, a fixed magnetization layer formed on another surface of the nonmagnetic layer, and a pinning layer (generally an antiferromagnetic layer) on the side of the fixed magnetization layer facing away from the non-magnetic layer. The free layer has its magnetization direction changing depending on an external signal magnetic field, and the fixed magnetization layer has its magnetization direction fixed by a magnetic field from the pinning layer (antiferromagnetic layer).

And now, common GMR heads used so far in the art have a CIP (current in plane) structure wherein a current for detecting magnetic signals (the so-called sense current) is passed parallel with the plane of each of the layers forming the GMR device (CIP-GMR device). On the other hand, GMR devices having the so-called CPP (current perpendicular to plane) structure wherein the sense current is passed perpendicularly to the plane of each of the layers forming the GMR device (CPP-GMR device), too, are now under development as next-generation ones.

The aforesaid TMR devices, too, would come under the CPP structure category according to a classification system from the current-passing direction alone. However, the multilayer construction and detection principle of the TMR device are different from those of the CPP-GMR device. That is, the TMR device generally comprises a free layer, a fixed magnetization layer, a tunnel barrier layer located between them, and an antiferromagnetic layer located on the plane of the fixed magnetized layer that faces away from its plane in contact with the tunnel barrier layer. The tunnel barrier layer is a nonmagnetic insulating layer through which electrons can pass in a state with spins reserved by the tunnel effect. The rest of the multilayer structure, i.e., the free layer, fixed magnetization layer and antiferromagnetic layer could be basically identical with those used with the spin valve type GMR device.

It is here noted that when the TMR device is used for a reproducing head, it is required to have low resistance for the following reasons. For a magnetic disk system, there is a demand for improved recording density and improved data transfer rate, with which the reproducing head is required to have good high-frequency response. However, as the resistance value of the TMR device grows large, it will cause an increase in stray capacitances occurring at the TMR device and a circuit connected to it, rendering the high-frequency response of the reproducing head worse. This is the reason the TMR device must inevitably have low resistance.

Generally speaking, reducing the thickness of the tunnel barrier layer would work for making the resistance of the TMR device low. However, too thin a tunnel barrier layer would cause a lot more pinholes to occur in the tunnel barrier layer, rendering the service life of the TMR device short. Further, there would be a magnetic couple produced between the free layer and the fixed magnetization layer, ending up with problems: a lot more noise, a drop of the MR ratio, and degradation of TMR device's performance. The noise occurring at the reproducing head is here called head noise. The head noise occurring at the reproducing head using the TMR device includes shot noise, a noise component that is unlikely to occur at a reproducing head using the GMR device. Thus, a problem with the reproducing head using the TMR device is that the head noise is noticeable.

With the CPP-GMR device, on the other hand, there is a problem that no large enough MR ratio is obtained. A possible reason for it could be that spin-polarized electrons are scattered at the interface between the nonmagnetic electroconductive layer and the magnetic layer, and in the nonmagnetic electroconductive layer.

Also, the CPP-GMR device, because of having a small resistance value, is low in terms of the amount of resistance change. For this reason, in order to obtain large reproduction output with the CPP-GMR device, high voltage must be applied to that device. However, the application of high voltage to the device offers such problems as described below. With the CPP-GMR device, currents are passed in the direction perpendicular to the plane of each layer, whereupon spin-polarized electrons are poured from the free layer into the fixed magnetization layer or from the fixed magnetization layer into the free layer. Such spin-polarized electrons cause torque (hereinafter called the spin torque) that rotates those magnetizations to be generated at the free layer or the fixed magnetization layer. The magnitude of this spin torque is proportional to the current density. As the voltage applied to the CPP-GMR device grows high, it causes the current density to grow large with the result that there is large spin torque. As the spin torque increases, there are problems such as changes in the direction of magnetization of the fixed magnetization layer, and the inability of the free layer to freely change the direction of magnetization with respect to an external magnetic field.

To solve such problems, Applicant has already filed Japanese Patent Application No. 2006-275972 to come up with an invention relating to a CPP-GMR device, with which large MR ratios are achieved while noise is held back and the influence of the spin torque is reduced.

That is to say, in a preferable embodiment of that invention, a spacer layer interposed between the free layer and the fixed magnetized layer has typically a Cu/ZnO/Cu multilayer structure, and the area resistivity of a magneto-resistive effect device and the electro-conductivity of the spacer layer are determined in such a way as to fall within the range of 0.1 to 0.3Ω·μm² and the range of 133 to 432 S/cm, respectively.

By allowing the spacer layer to have typically a three-layer structure of Cu/ZnO/Cu according to this proposal, large MR ratios are achievable while holding back noise and reducing the influence of the spin torque.

The present invention is an invention for making improvements in or relating to Japanese Patent Application No. 2006-275972, and embodied as follows.

That is, when, in Japanese Patent Application No. 2006-275972, it is intended to limit the area resistivity and electro-conductivity of the device within the predetermined ranges, the semiconductor layer represented by ZnO and used as the intermediate layer of the triple-layer structure of the spacer layer must be as thin as about 1.2 to 2.0 nm. A semiconductor layer having a thickness of greater than 2.0 nm does not only cause the area resistivity of the device to grow too large, but also there is a tendency for shot noise to occur as is the case with the tunnel barrier (TMR) using an ordinary insulating layer or semiconductor layer. As a result, even at an improved MR ratio, a noise component tends to grow large, resulting in a worsening of the S/N.

Of course, there is no problem with the use of a thickness of as small as about 1.2 to 2.0 nm, if devices are produced under severe production conditions and quality control. However, as the semiconductor layer represented by ZnO is thin, there are a lot more pinholes occurring due to thickness variations on film formation, which may possibly give rise to a worsening of characteristics reliability due to such electromigration as found in the so-called current narrowing type CPP-GMR. Further, on polishing, there may possibly be a short circuit occurring in Cu layer on each side of ZnO, which may further bring about phenomena: the occurrence of noises and the deterioration of the MR change rate. Still further, there may be disturbances in the crystal lattices of ZnO with varying film-formation conditions such as partial oxygen pressure, and the larger the thickness, the more often this would occur; with decreasing thickness, the volume fraction of a portion affected by lattice disturbances increases.

Thus, with design specifications where the semiconductor layer used as the intermediate layer of the triple-layer structure of the spacer layer and represented by ZnO grows thin, a variety of troubles may possibly be caused.

Therefore, with regard to the semiconductor layer used as the intermediate layer of the triple-layer structure of the spacer layer, there is a mounting demand for specifications where that layer can be reduced as much as possible while the area resistivity of the device is kept low as desired and an increase in the noise component (the shot noise occurring upon tunnel conduction in particular) is prevented.

Note here that the prior art that seems to be most relevant to the invention of this application is JP-A-2003-8102. This prior art sets forth a CPP-GMR device comprising a fixed magnetization layer having a fixed magnetization direction, a free magnetization layer with its magnetization direction changing depending on an external magnetic field, a nonmagnetic metal intermediate layer interposed between the fixed magnetization layer and the free magnetization layer, and a resistance control layer interposed between the fixed magnetization layer and the free magnetization layer and formed of a material having conduction carriers of up to $10^{22}/cm^3$. The prior art shows a semiconductor as one of resistance control layer materials; however, it does not suggest at al about the requirements for the invention of this application.

SUMMARY OF THE INVENTION

To provide a problem to such problems as mentioned above, the invention provides a giant magneto-resistive effect device (CPP-GMR device) having a CPP (current perpendicular to plane) structure comprising a spacer layer, and a first ferromagnetic layer and a second ferromagnetic layer stacked one upon another with said spacer layer interposed between them, with a sense current applied in a stacking direction, wherein said spacer layer comprises a first nonmagnetic metal layer and a second nonmagnetic metal layer, each made of a nonmagnetic metal material, and a semiconductor oxide layer interposed between said first nonmagnetic metal layer and said second nonmagnetic metal layer, said semiconductor oxide layer that forms a part of said spacer layer contains zinc oxide as its main component wherein said main component zinc oxide contains an additive metal, and said additive metal is less likely to be oxidized than zinc.

In a preferable embodiment of the invention, said additive metal is at least one selected from among Cu, Ag, Sn, Pt, and Au.

In a preferable embodiment of the invention, the content of said additive metal is such that there is none of shot noise that is quantum noise and ohmic conduction is kept intact.

In a preferable embodiment of the invention, the content of said additive metal is 1.0 to 8.0 metal atomic % (metal at %).

In a preferable embodiment of the invention, said semiconductor oxide layer that forms a part of said spacer layer has a thickness of 1.0 to 3.5 nm.

In a preferable embodiment of the invention, said first, and said second non-magnetic metal layer is at least one selected from among Cu, Au, and Ag.

In a preferable embodiment of the invention, said first, and said second non-magnetic layer has a thickness of 0.3 to 2.0 nm.

In a preferable embodiment of the invention, the aforesaid magneto-resistive effect device has an area resistivity of 0.1 to 0.3Ω·μm².

In a preferable embodiment of the invention, said spacer layer has an electroconductivity of 133 to 432 S/cm.

In a preferable embodiment of the invention, said second ferromagnetic layer is a free layer which functions such that a magnetization direction changes depending on an external magnetic field, and said first ferromagnetic layer is a fixed magnetization layer which has a magnetization direction fixed.

The invention also provides a thin-film magnetic head, comprising a plane opposite to a recoding medium, the aforesaid magneto-resistive effect device, which is located near said medium opposite plane for detecting a signal magnetic field from said recording medium, and a pair of electrodes for passing a current in the stacking direction of said magneto-resistive effect device.

Further, the invention provides a head gimbal assembly, comprising a slider including the aforesaid thin-film magnetic head and located in opposition to a recording medium, and a suspension adapted to resiliently support said slider.

Furthermore, the invention provides a magnetic disk system, comprising a slider including the aforesaid thin-film magnetic head and located in opposition to a recording medium, and a positioning means adapted to support and position said slider with respect to said recording medium.

The invention provides a giant magneto-resistive effect device (CPP-GMR device) having a CPP (current perpendicular to plane) structure comprising a spacer layer, and a first ferromagnetic layer and a second ferromagnetic layer stacked one upon another with said spacer layer interposed between them, with a sense current applied in a stacking direction, wherein said free layer functions such that the direction of magnetization changes depending on an external magnetic field, said spacer layer comprises a first nonmagnetic metal layer and a second nonmagnetic metal layer, each made of a nonmagnetic metal material, and a semiconductor oxide layer interposed between said first nonmagnetic metal layer and said second nonmagnetic metal layer, said semiconductor oxide layer that forms a part of said spacer layer contains zinc oxide as its main component wherein said main component zinc oxide contains an additive metal, and said additive metal is less likely to be oxidized than zinc. It is thus possible to keep the area resistivity of the device low as desired, and make the semiconductor oxide layer forming a part of the spacer layer thick while holding back any noise increase. This makes sure the excellent advantages that any variation of the area resistivity of the device is inhibited while the S/N is prevented from getting worse, and the reliability of film characteristics is much more improved.

DETAILED EXPLANATION OF THE INVENTION

The best mode for carrying out the invention is now explained in details.

Figure 1:
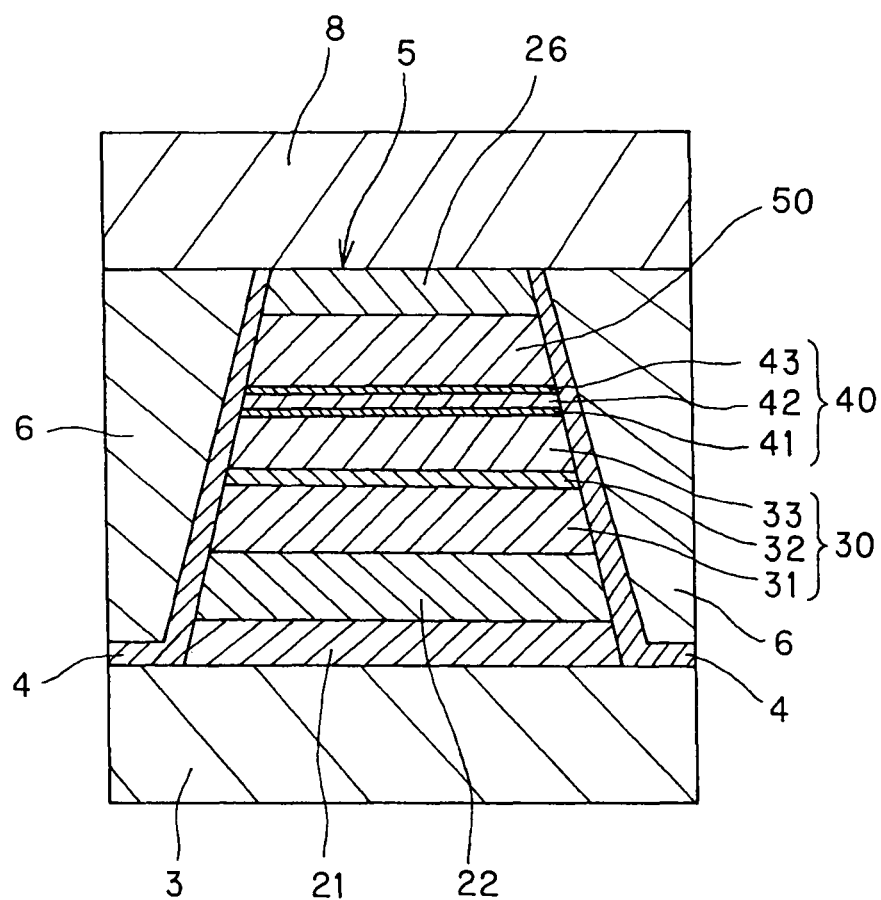
FIG. 1 is a sectional view illustrative of a section of the reproducing head in the embodiment of the invention, which is substantially parallel with the medium opposite plane.

FIG. 1 is illustrative of the ABS (air bearing surface) of the reproducing head in an embodiment of the invention; FIG. 1 is illustrative in schematic of the ABS of the giant magneto-resistive effect device of the CPP structure (CPP-GMR device)—part of the invention. The "ABS" is generally corresponding to a plane (hereinafter often called the medium opposite plane) at which a reproducing head is in opposition to a recording medium; however, it is understood that the "ABS" here includes even a section at a position where the multilayer structure of the device can be clearly observed. For instance, a protective layer such as DLC or the like (the protective layer adapted to cover the device), in a strict sense, positioned facing the medium opposite plane may be factored out, if necessary.

Figure 2:
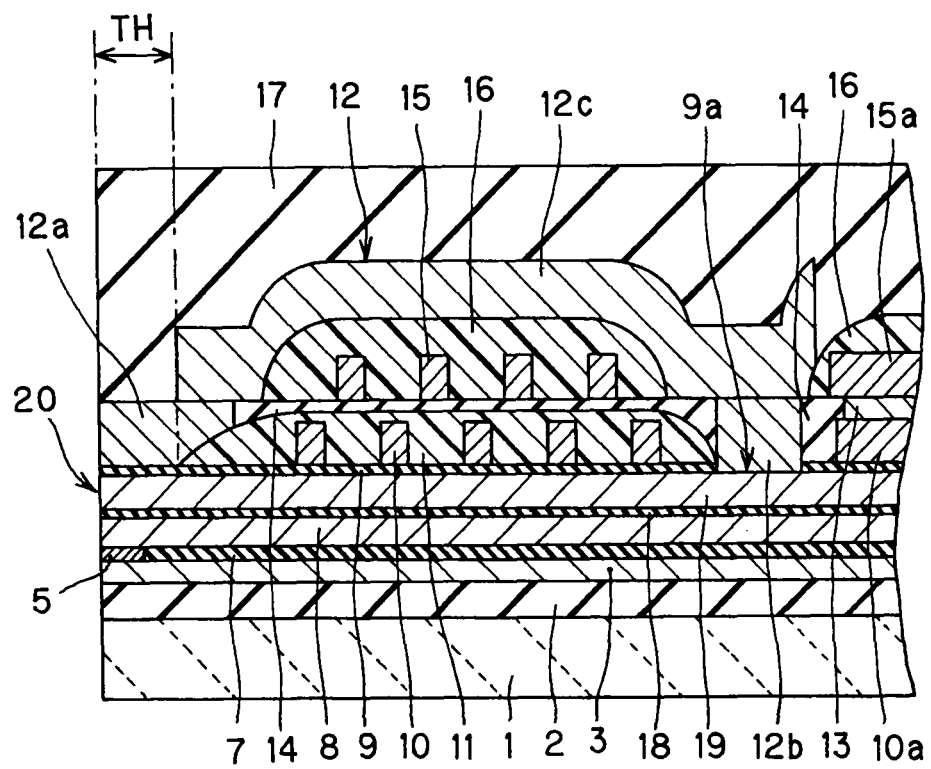
FIG. 2 is illustrative of the construction of the thin-film magnetic head according to one preferable embodiment of the invention; it is a sectional view illustrative of a section of the thin-film magnetic head perpendicular to the medium opposite plane and the substrate.

FIG. 2 is illustrative of the construction of the thin-film magnetic head according to one preferable embodiment of the invention or it is a sectional view illustrative of the thin-film magnetic head perpendicular to the ABS and substrate.

Figure 3:
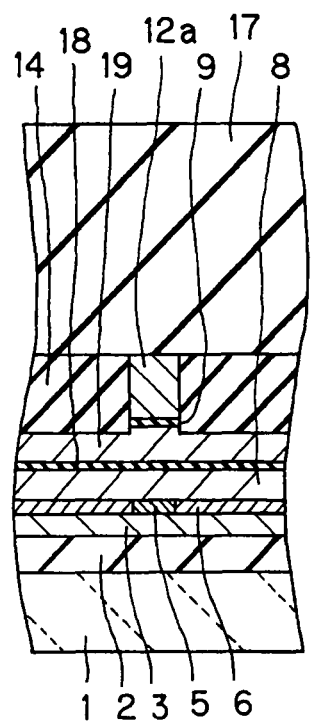
FIG. 3 is illustrative of the construction of the thin-film magnetic head according to one preferable embodiment of the invention; it is a sectional view illustrative of a section of a magnetic pole portion of the thin-film magnetic head parallel with the medium opposite plane.

FIG. 3 is illustrative of the construction of the thin-film magnetic head according to one preferable embodiment of the invention: it is a sectional view illustrative of a section of a magnetic pole portion of the thin-film magnetic head parallel with the ABS.

Figure 4:
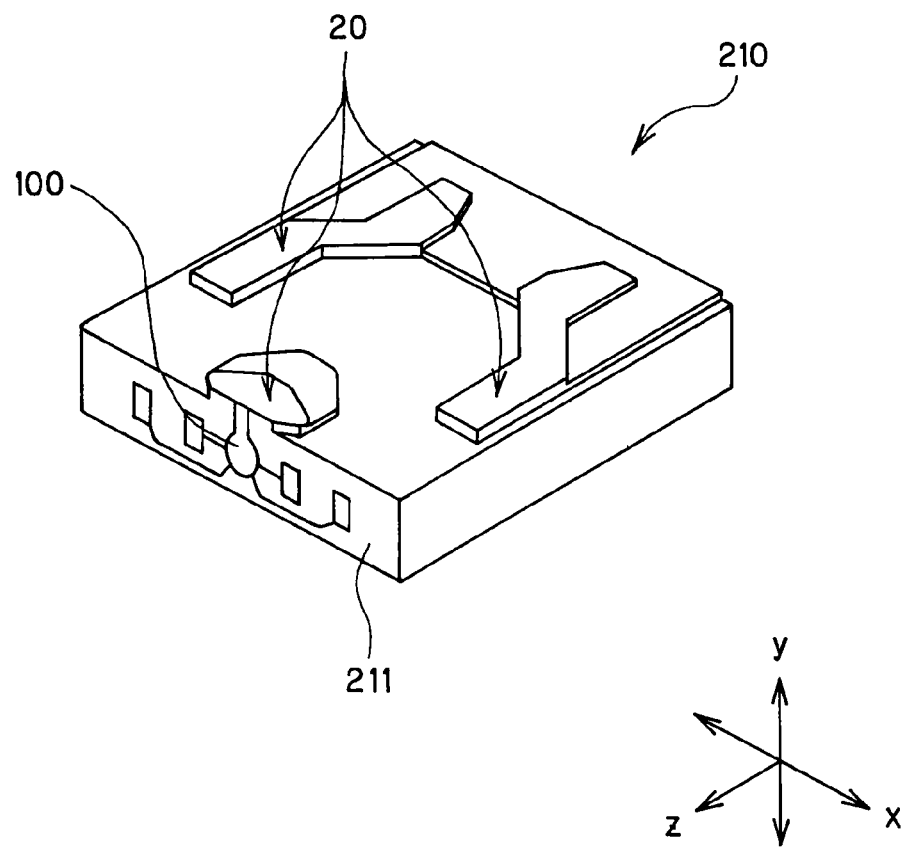
FIG. 4 is a perspective view of a slider built in the head gimbal assembly according to one embodiment of the invention.
Figure 5:
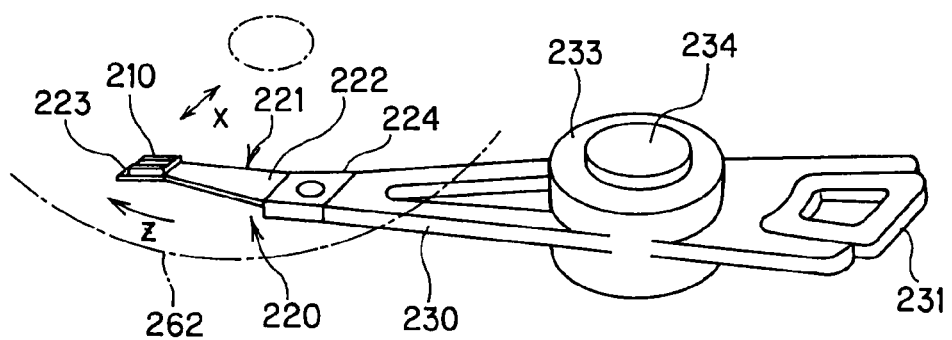
FIG. 5 is a perspective view of a head arm assembly including the head gimbal assembly according to one embodiment of the invention.
Figure 6:
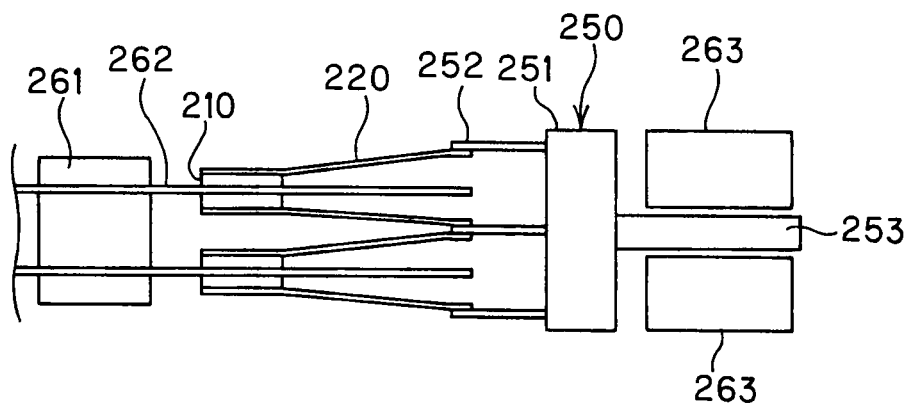
FIG. 6 is illustrative of part of the magnetic disk system according to one embodiment of the invention.
Figure 7:
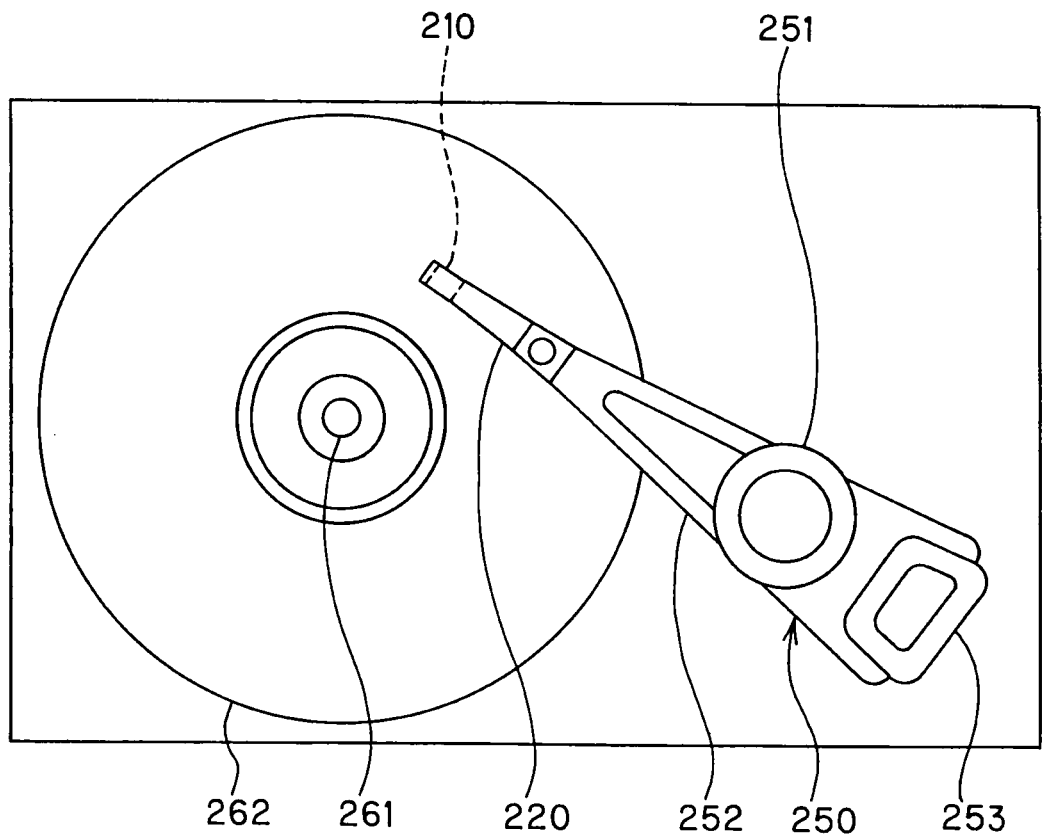
FIG. 7 is a plan view of the magnetic disk system according to one embodiment of the invention.

FIG. 4 is a perspective view of a slider built in the head gimbal assembly according to one embodiment of the invention; FIG. 5 is a perspective view of a head arm assembly including the head gimbal assembly according to one embodiment of the invention; FIG. 6 is illustrative of part of the magnetic disk system according to one embodiment of the invention; and FIG. 7 is a plan view of the magnetic disk system according to one embodiment of the invention.

[Giant Magneto-Resistive Effect Device of the CPP Structure (CPP-GMR Device]

The construction of the reproducing head comprising the inventive giant magneto-resistive effect device of the CPP structure (CPP-GMR device) is now explained in details with reference to FIG. 1.

As noted above, FIG. 1 is a sectional view corresponding to a section of the reproducing head parallel with the medium opposite plane.

As shown in FIG. 1, the reproducing head according to the embodiment here comprises a first shield layer 3 and a second shield layer 8 that are vertically (on the sheet) opposed to each other at a given space, a giant magneto-resistive effect device 5 (hereinafter referred simply to as the GMR device 5) disposed between the first shield layer 3 and the second shield layer 8, an insulating film 4 adapted to cover two sides of the GMR device 5 and a part of the upper surface of the first shield layer 3 along these sides, and two bias magnetic field-applying layers 6 adjacent to the two sides of the GMR device 5 via the insulating layer 4.

The first 3 and the second shield layer 8 take a so-called magnetic shield role plus a pair-of-electrodes role. In other words, they have not only a function of shielding magnetism but also function as a pair of electrodes adapted to pass a sense current through the GMR device in a direction intersecting the plane of each of the layers forming the GMR device 5, for instance, in the direction perpendicular to the plane of each of the layers forming the GMR device (stacking direction).

It is acceptable that besides the first shield layer 3 and the second shield layer 8, the GMR device is vertically provided with another pair of electrodes.

The reproducing head of the invention comprises the GMR device 5 of the CPP structure—part of the invention.

In terms of an easy-to-understand, broad conception, the GMR device 5 of the CPP structure according to the invention comprises a spacer layer 40, and a fixed magnetization layer 30 (a first ferromagnetic layer) and a free layer 50 (a second ferromagnetic layer) that are stacked one upon another with the spacer layer 40 held between them, as shown in FIG. 1. And then, a sense current is applied to the GMR device 5 in its stacking direction to enable its function. In short, there is the GMR device 5 of the CPP (current perpendicular to plane) structure involved.

The free layer 50 has its magnetization direction changing dependent on an external magnetic field, viz., a signal magnetic field from a recording medium, while the fixed magnetization layer 30 has its magnetization direction remaining fixed under the action of an anti-ferromagnetic layer 22. Although FIG. 1 shows the embodiment wherein the antiferromagnetic layer 22 is formed on the bottom side (the side of the first shield layer 3), it is understood that the antiferromagnetic layer 22 may be located on the top side (the side of the second shield layer 8) to reverse the free layer 50 and fixed magnetization layer 30 in position.

(Explanation of the Fixed Magnetization Layer 30)

In the invention, the fixed magnetization layer 30 is formed on the antiferromagnetic layer 22 having a pinning action via an underlay layer 21 formed on the first shield layer 3.

In a preferable embodiment of the invention, that fixed magnetization layer 30 has a so-called synthetic pinned layer comprising, in order from the side of the antiferromagnetic layer 22, an outer layer 31, a non-magnetic intermediate layer 32 and an inner layer 33, all stacked together in order.

The outer layer 31 and the inner layer 33 are each made up of a ferromagnetic layer comprising a ferromagnetic material such as Co or Fe. The outer layer 31 and the inner layer 33 are antiferromagnetically coupled and fixed such that their magnetization directions are opposite to each other.

The outer layer 31 and the inner layer 33 are preferably each made of an alloy layer such as $Co_{70}Fe_{30}$ (atomic %). The outer layer has a thickness of preferably about 2 to 7 nm, and the inner layer 33 has a thickness of preferably about 2 to 10 nm. The inner layer 33 may also contain a Heusler alloy layer.

For instance, the nonmagnetic intermediate layer 32 is made of a nonmagnetic material containing at least one selected from the group consisting of Ru, Rh, Ir, Re, Cr, Zr and Cu, and has a thickness of typically about 0.3 to 1.0 nm. The nonmagnetic intermediate layer 32 is provided to fix the magnetization of the inner layer 33 and the magnetization of the outer layer 31 in mutually opposite directions. The phrase "magnetization in mutually opposite directions" stands for a broad concept that encompasses just only two such magnetizations in just opposite directions of 180° but also those in different directions of 180°±20° as well.

(Explanation of the Free Layer 50)

The free layer 50 has the direction of magnetization changing depending on an external magnetic field, viz., a signal magnetic field from the recording medium, and is made of a ferromagnetic layer (soft magnetic layer) having a decreased coercive force. The free layer 50 has a thickness of typically about 2 to 10 nm. The free layer 50 may be made of a single layer alone or, alternatively, it may be of a multilayer structure having multiple ferromagnetic layers. The free layer 50 may also contain a Heusler alloy layer.

On such free layer 50, as shown in FIG. 1, there is a protective layer 26 formed, which comprises a Ta or Ru layer as an example. The protective layer 26 has a thickness of about 0.5 to 20 nm.

(Explanation of the Spacer Layer 40)

The spacer layer 40 according to the invention comprises a first nonmagnetic metal layer 41, a second nonmagnetic metal layer 43 and a semiconductor oxide layer 42 interposed between the first 41 and the second nonmagnetic metal layer 43.

More specifically, there is a triple-layer multilayer structure involved in which the first nonmagnetic metal layer 41/semiconductor oxide layer 42/second nonmagnetic metal layer 43 are stacked together in order. In the embodiment here, the first nonmagnetic metal layer 41 is positioned on the side of the fixed magnetization layer 30 and the second nonmagnetic metal layer 43 is positioned on the side of the free layer 50, as shown in FIG. 1. In what follows, each component element is now explained.

Semiconductor Oxide Layer 42

The semiconductor oxide layer 42 that forms a part of the spacer layer 40 is composed mainly of zinc oxide (ZnO) that contains as an additive metal a metal less likely to be oxidized than zinc. Whether or not that metal is less likely to be oxidized than zinc (Zn) may just as well be judged by reference to a standard electrode potential $E^0$. The standard electrode potential $E^0$ here is an electrode potential in a standard state (25° C., 1 atm) based on a standard hydrogen electrode: SHE.

A metal having a smaller standard electrode potential $E^0$ value is preferentially oxidized; the metal added herein should have a larger standard electrode potential $E^0$ value than that for Zn. The additive metal preferably used herein is at least one selected from among Cu, Ag, Sn, Pt, and Au.

The content of that additive metal should be such that there is none of the shot noise that is quantum noise while ohmic conduction is kept intact. More exactly, there is the mention of 1.0 to 8.0 metal atomic % (metal at %), preferably 1.0 to 3.0 metal atomic %. At less than 1.0 metal atomic %, the advantage of the invention that the reliability of film characteristics is much more improved with reduced or limited fluctuations of device's area resistivity will not fully work. As that content is greater than 8.0 metal atomic %, on the other hand, the additive metal will behave as impurities, so the MR ratio will drop. This will in turn cause the S/N to tend to drop.

When two or more such additive metals are contained, the combined content should again be pursuant to the aforesaid basic principle, i.e., such that there is none of the shot noise that is quantum noise while ohmic conduction is kept intact. To be more specific, the combined content is preferably in the range of 1.0 to 8.0 metal atomic %.

It is still technically less clear why the advantage of the invention works through what mechanism by containing in the main component zinc oxide (ZnO) the additive metal less likely to be oxidized than zinc; however, there is the phenomenon supposed to have occurred in which by influences of lattice changes such as crystal lattice strain due to the addition of the given metal(s), oxygen deficiency or the like, there could be an increase in the critical thickness enabling ohmic conduction, and the thickness by the time the shot noise starts to be observed could grow large, with the result that the ZnO thickness margin could grow wide.

It is here noted that when a metal more likely to be oxidized than zinc (Zn) contrary to the idea of the invention, for instance, Ba, Sr, Ca, Na, Mg, Al, Ti, Zr, and Mn is added, not only would the advantage of the invention work but there would be also inconvenience that the film thickness range indicative of ohmic conduction grows narrow with any thickness margin unavailable.

In the invention, the additive metal less likely to be oxidized than zinc may be added to the main component zinc oxide (ZnO) by, for instance, applying a given additive metal sheet to a ZnO target into a composite target and then sputtering that composite target or, alternatively, co-sputtering ZnO and the given additive metal. Yet alternatively, the given additive metal is mixed with ZnO, and the mixture is then fired into a target, followed by ordinary sputtering.

After film formation, such a thin film is usually heat treated (at 200 to 350% for 1 to 10 hours) for the purpose of crystallizing the ZnO film to make the resistance of the film low. The wording "film formation" here is indicative of both after the film formation of the semiconductor oxide layer and after the film formation of the overall device. Ordinarily, the heat treatment is carried out after the film formation of the whole device.

Such semiconductor oxide layer 42 has a thickness in the range of 1.0 to 3.5 nm, preferably 1.4 to 3.5 nm, and more preferably 1.6 to 3.0 nm. A thickness of less than 1.0 nm tends to give rise to inconvenience that the device characteristics inclusive of device's area resistivity AR fluctuates largely. A thickness of greater than 3.5 nm, on the other hand, tends to give rise to inconvenience that the MR characteristics deteriorate due to spin scattering. There is another inconvenience: a deviation from the resistance area demanded for the CPP-GRM device.

First Nonmagnetic Metal Layer 41 and Second Nonmagnetic Metal Layer 43

The first 41 and the second nonmagnetic metal layer 43 are each made of at least one nonmagnetic metal material selected from among, for instance, Cu, Au, Ag, AuCu, CuZn, Cr, Ru, Rh and Pt, of which Cu, Au, and Ag is most preferable.

The first 41 and the second nonmagnetic metal layer 43 each have a thickness of about 0.3 to 2.0 nm.

The electroconductivity of the spacer layer 40 of such construction is desirously in the range of 133 to 432 S/cm. The electroconductivity of the spacer layer 40 is defined as the reciprocal of the resistivity ($\Omega \cdot cm$) of the spacer layer 40.

(Explanation of the Antiferromagnetic Layer 22)

The antiferromagnetic layer 22 works such that by way of exchange coupling with the fixed magnetization layer 30 as described above, the magnetization direction of the fixed magnetization layer 30 stays fixed.

For instance, the antiferromagnetic layer 22 is made of an antiferromagnetic material containing at least one element M' selected from the group of Pt, Ru, Rh, Pd, Ni, Cu, Ir, Cr and Fe, and Mn. The content of Mn is preferably 35 to 95 at %. The antiferromagnetic material is roughly broken down into two types: (1) a non-heat treatment type antiferromagnetic material that shows anti-ferromagnetism even in the absence of heat treatment to induce an exchange coupling magnetic field between it and a ferromagnetic material, and (2) a heat treatment type antiferromagnetic material that comes to show anti-ferromagnetism by heat treatment. In the invention, both types (1) and (2) may be used without restriction. For instance, the non-heat treatment type antiferromagnetic material is exemplified by RuRhMn, FeMn, and IrMn, and the heat treatment type antiferromagnetic material is exemplified by PtMn, NiMn, and PtRhMn.

The antiferromagnetic layer 22 has a thickness of about 4 to 30 nm.

For the layer for fixing the direction of magnetization of the fixed magnetization layer 30, it is acceptable to provide a hard magnetic layer made of a hard magnetic material such as CoPt in place of the aforesaid antiferromagnetic layer.

The underlay layer 21 formed below the anti-ferromagnetic layer 22 is provided to improve the crystallization and orientation of each of the layers stacked on it in general, and the exchange coupling of the antiferromagnetic layer 22 and the fixed magnetization layer 30 in particular. For such underlay layer 21, for instance, a multilayer structure of Ta and NiCr layers is used. The underlay layer 21 has a thickness of typically about 2 to 6 nm.

The magneto-resistive effect device 5 of the invention (CPP-GMR device 5) should have an area resistivity, AR, in the range of 0.1 to $0.3\Omega \cdot \mu M^2$, preferably 0.12 to $0.3\Omega \cdot \mu m^2$, and more preferably 0.14 to $0.28\Omega \cdot m^2$. Any departure from the range of 0.1 to $0.3\Omega \cdot m^2$ would render it difficult to obtain large MR ratios while holding back noises and the influences of spin torque.

The device (CPP-GMR device), for which the area resistivity AR is to be measured, is a multilayer structure of underlay layer 21, antiferromagnetic layer 22, fixed magnetization layer 30, spacer layer 40, free layer 50 and protective layer 26, as shown in FIG. 1.

Further, the insulating layer 4 shown in FIG. 1, for instance, is made of alumina. For the bias magnetic field-applying layer 6, for instance, use is made of a hard magnetic layer (hard magnet), and a multilayer structure of a ferromagnetic layer and antiferromagnetic layer. More specifically, use is made of CoPt and CoCrPt.

The giant magneto-resistive effect device of the CPP structure (CPP-GMR device) in the aforesaid embodiments, for instance, may be formed by vacuum film-formation techniques such as sputtering. Optionally or if necessary, heat treatment may be applied to the device after its formation.

(Explanation of the Whole Construction of the Thin-Film Magnetic Head)

The whole construction of the thin-film magnetic head comprising the aforesaid magneto-resistive effect device is now explained. As already mentioned, FIGS. 2 and 3 are illustrative of the construction of the thin-film magnetic head according to one preferred embodiment of the invention; FIG. 2 is illustrative of a section of the thin-film magnetic head perpendicular to the ABS and substrate and FIG. 3 is illustrative of a section of a magnetic pole portion of the thin-film magnetic head parallel with the ABS.

The whole structure of the thin-film magnetic head will be better understood when consideration is given to its fabrication process steps; the whole structure of the thin-film magnetic head is now explained with reference to its fabrication process steps.

First of all, an insulating layer 2 comprising an insulating material such as alumina ($Al_2O_3$) or silicon dioxide ($SiO_2$) is formed by sputtering or like techniques on a substrate 1 comprising a ceramic material such as AlTiC ($Al_2O_3.TiC$). That insulating layer has a thickness of about 0.5 to 20 μm as an example.

Then, a lower shield layer 3 comprising a magnetic material and adapted for a reproducing head is formed on that insulating layer 2. The shield layer 3 has a thickness of about 0.1 to 5 μm as an example. The magnetic material used for such lower shield layer 3, for instance, includes FeAlSi, NiFe, CoFe, CoFeNi, FeN, FeZrN, FeTaN, CoZrNb, and CoZrTa. The lower shield layer 3 is formed by sputtering, plating or like other techniques.

Then, a reproducing CPP-GMR device 5 is formed on the lower shield layer 3.

Although not shown, an insulating film is then formed in such a way as to cover two sides of the CPP-GMR device and the upper surface of the first shield layer 3. The insulating film is formed of an insulating material such as alumina.

Then, two bias magnetic field-applying layers 6 are formed in such a way as to be adjacent to the two sides of the CPP-GMR device 5 via the insulating layer. Then, an insulating film 7 is formed in such a way as to be located around the CPP-GMR device 5 and bias magnetic field-applying layers 6. The insulating film 7 is formed of an insulating material such as alumina.

Then, a second shield layer 8 for the reproducing head, comprising a magnetic material, is formed on the CPP-GMR device 5, bias magnetic field-applying layers 6 and insulating layer 7. The second shield layer 8, for instance, is formed by means of plating or sputtering.

Then, a separation layer 18 comprising an insulating material such as alumina is formed by sputtering or the like on the upper shield layer 8. Then, a lower magnetic pole layer 19, comprising a magnetic material and adapted for a recording head, is formed by plating, sputtering or the like on the separation layer 18. The magnetic material used for the second shield layer 8, and the lower magnetic pole layer 19, for instance, includes a soft magnetic material such as NiFe, CoFe, CoFeNi, and FeN. It is here noted that instead of the multilayer arrangement of the second shield layer 8, separation layer 18 and lower magnetic pole layer 19, it is acceptable to configure the second shield layer in such a way as to work also as a lower electrode layer.

Then, a recording gap layer 9 comprising a non-magnetic material such as alumina is formed by sputtering or the like on the lower magnetic pole layer 19. That recording gap layer has a thickness of about 50 to 300 nm.

For the formation of a magnetic path, the recording gap layer 9 is then partially etched at the center of the thin-film coil to be described later to form a contact hole 9a.

Then, a first layer portion 10 of the thin-film coil, typically comprising copper (Cu), is formed on the recording gap layer 9 at a thickness of typically 2 to 3 µm. In FIG. 2, note that reference numeral 10a stands for a connector portion of the first layer portion 10, which is to be connected to a second layer portion 15 of the thin-film coil to be described later. The first layer portion 10 is wound around the contact hole 9a.

Then, an insulating layer 11 comprising a photo-resist or other organic material having fluidity upon heating is formed in such a given pattern as to cover the first layer portion 10 of the thin-film coil and the surrounding recording gap layer 9.

Then, the insulating layer 11 is heat treated at a given temperature to make its surface flat. By this heat treatment, each of the edge portions of the outer and inner peripheries of the insulating layer 11 is configured into a rounded slant.

Then, in an area of the insulating layer 11 from a slant portion on the medium opposite plane 20 (to be described later) side to the medium opposite plane 20 side, a track width-setting layer 12a of an upper magnetic pole layer 12 is formed on the recording gap layer 9 and insulating layer 11, using the magnetic material for the recording head. The upper magnetic pole layer 12 is made up of that track width-setting layer 12a, and a coupler portion layer 12b and a yoke portion layer 12c to be described later.

The track width-setting layer 12a is formed on the recording gap layer 9, including an end portion that provides a magnetic pole portion of the upper magnetic pole layer 12 and a connector portion that is formed on the slant portion of the insulating layer 11 on the medium opposite plane 20 side and connected to the yoke portion layer 12c. The width of that end portion is set equal to the recording track width, and the width of the connector portion is greater than the width of the end portion.

Simultaneously with the formation of the track width-setting layer 12a, the coupler portion 12b comprising a magnetic material is formed on the contact hole 9a and a connector layer 13 comprising a magnetic material is formed on the connector portion 10a. The coupler portion layer 12b forms a portion of the upper magnetic pole layer 12, which is to be magnetically connected to the upper shield layer 8.

Then, magnetic pole trimming is carried out. That is, in an area around the track width-setting layer 12a, the track width-setting layer 12a is used as a mask to etch at least a part of the recording gap layer 9 and the magnetic pole portion of the upper shield layer 8 on the recording gap layer 9 side, whereby, as shown in FIG. 3, there is a trim structure formed, in which at least a part of the magnetic pole portion of the upper magnetic pole layer 12, the recording gap layer 9 and the magnetic pole portion of the upper shield layer 8 has a uniform width. This trim structure makes sure prevention of an effective increase in the track width due to the spread of a magnetic flux near the recording gap layer 9.

Then, an insulating layer 14 comprising alumina or other inorganic insulating material is formed around the whole at a thickness of typically 3 to 4 µm.

Then, that insulating layer 14 is polished by chemo-mechanical polishing or the like as far as the surfaces of the track width-setting layer 12a, coupler portion layer 12b and connector layer 13 for flattening.

Then, the second layer portion 15 of the thin-film coil typically comprising copper (Cu) is formed on the flattened insulating layer 14 at a thickness of typically 2 to 3 µm. In FIG. 2, note that reference numeral 15a is indicative of a connector portion of the second layer portion 15, which is to be connected to the connector portion 10a of the first layer portion 10 of the thin-film coil by way of the connector layer 13. The second layer portion 15 is wound around the coupler portion layer 12b.

Then, an insulating layer 16 comprising a photo-resist or other organic material having fluidity upon heating is formed in such a given pattern as to cover the second layer portion 15 of the thin-film coil and the surrounding insulating layer 14.

Then, the insulating layer 16 is heat treated at a given temperature to make its surface flat. By this heat treatment, each of the edge portions of the outer and inner peripheries of the insulating layer 16 is configured into a rounded slant.

Then, the magnetic material for the recording head such as permalloy is used to form the yoke portion layer 12c forming the yoke portion of the upper magnetic layer 12 on the track width-setting layer 12a, insulating layers 14, 16 and coupler portion layer 12b. An end of the yoke layer portion 12c on the medium opposite plane 20 side is spaced away from the medium opposite plane 20, and the yoke portion layer 12c is connected to the lower magnetic pole layer 19 by way of the coupler portion layer 12b.

Then, an overcoat layer 17 typically comprising alumina is formed in such a way as to cover the whole. Finally, a slider including the aforesaid respective layers is machined to form the medium opposite plane 20 of the thin-film head including the recording head and reproducing head in the form of a complete thin-film magnetic head.

The thus fabricated thin-film magnetic head comprises the medium opposite plane 20 in opposition to the recording medium, the aforesaid reproducing head and the recording head (induction type of magnetic device).

The magnetic head comprises the lower and upper magnetic pole layers 19 and 12 that include mutually opposite magnetic pole portions on the medium opposite plane 20 side and are magnetically coupled to each other, the recording gap layer 9 located between the magnetic pole portion of the lower magnetic pole layer 19 and the magnetic pole portion of the upper magnetic pole layer 12, and the thin-film coils 10, 15 at least a part of which is located between the lower 19 and the upper magnetic pole layer 12 while insulated from them.

As shown in FIG. 2, such a thin-film magnetic head has a throat height (indicated by TH in the drawing) that is defined by a length from the medium opposite plane 20 up to the end of the insulating layer 11 on the medium opposite plane side. Note here that the "throat height" means a length (height) from the medium opposite plane 20 to a position at which the two magnetic pole layers start being spaced away.

(Explanation of how the Thin-Film Magnetic Head Works)

How the thin-film magnetic head according to the embodiment here works is now explained. The thin-film magnetic head records information in the recording medium by the recording head, and plays back the information recorded in the recording medium by the reproducing head.

At the reproducing head, the direction of a bias magnetic field applied by the bias magnetic field-applying layers 6 is orthogonal to the direction perpendicular to the medium opposite plane 20. At the CPP-GMR device 5 with no signal magnetic field applied yet, the magnetization direction of the free layer 50 lies in the direction of the bias magnetic field, and the magnetization direction of the fixed magnetization layer 30 is fixed in a direction perpendicular to the medium opposite plane 20.

At the CPP-GMR device 5, there is a change in the magnetization direction of the free layer 50 depending on a signal magnetic field from the recording medium, which in turn causes a change in the relative angle between the magnetization direction of the free layer 50 and the magnetization direction of the fixed magnetization layer 30, with the result that there is a change in the resistance value of the CPP-GMR device 5. The resistance value of the CPP-GMR device 5 may be found from a potential difference between the first and second shield layers 3 and 8, i.e., the two electrode layers 3 and 8 at the time when a sense current is passed through the CPP-GMR device 5. It is thus possible for the reproducing head to play back the information recorded in the recording medium.

(Explanation of the Head Gimbal Assembly and the Magnetic Disk System)

The head gimbal assembly and the magnetic disk system according to the embodiment here are now explained.

A slider 210 included in the head gimbal assembly is first explained with reference to FIG. 4. In the magnetic disk system, the slider 210 is located in such a way as to face a hard disk that is a rotationally driven disk-form recording medium. This slider 210 primarily comprises a substrate 211 built up of a substrate 1 and an overcoat 17 depicted in FIG. 2.

The substrate 211 is in a generally hexahedral shape. Of the six surfaces of the substrate 211, one surface is in opposition to the hard disk. On that one surface there is a medium opposite plane 20 formed.

As the hard disk rotates in the z-direction in FIG. 4, it causes an air flow passing between the hard disk and the slider 210 to induce lift relative to the slider 210 in the downward y-direction in FIG. 4. This lift in turn causes the slider 210 to levitate over the surface of the hard disk. Note here that the x-direction in FIG. 4 traverses tracks on the hard disk.

Near the end of the slider 210 on an air exit side (the left lower end in FIG. 4), there is the thin-film magnetic head 100 formed according to the invention.

A head gimbal assembly 220 according to this embodiment is now explained with reference to FIG. 5. The head gimbal assembly 220 comprises a slider 210 and a suspension 221 adapted to resiliently support that slider 210. The suspension 221 comprises a leaf spring-form load beam 222 formed typically of stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

FIG. 5 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One example of the head stack assembly and the magnetic disk system according to the instant embodiment are now explained with reference to FIGS. 6 and 7.

FIG. 6 is illustrative of part of the magnetic disk system, and FIG. 7 is a plan view of the magnetic disk system.

A head stack assembly 250 comprises a carriage 251 having a plurality of arms 252. The plurality of arms 252 are provided with a plurality of the head gimbal assemblies 220 such that they line up vertically at an interval. On the side of the carriage 251 that faces away from the arms 252, there is a coil 253 attached, which coil becomes a part of the voice coil motor. The head stack assembly 250 is incorporated in the hard disk system.

The magnetic disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the magnetic disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the magnetic disk system here have pretty much the same action as the thin-film magnetic head according to the foregoing embodiment.

While the embodiment here has been described with reference to the thin-film magnetic head of the structure wherein the reproducing head is located on the substrate side and the recording head is stacked on the reproducing head, it is contemplated that that order of stacking could be reversed. When the thin-film magnetic head here is used as a read-only head, the recording head could be removed from it.

It is also contemplated that part of the invention may be applied not only to magnetic heads but also as a so-called thin-film magnetic field sensor adapted to detect a magnetic field.

EXAMPLES

The invention concerning the CPP-GMR device as described above is now explained in more details with reference to the following specific examples.

Experimental Example I

An inventive CPP-GMR device sample having such multilayer construction as set out in Table 1 and a reference CPP-GMR device sample were formed by sputtering and readied up for experimentation. Note here that in the actual preparation of specific samples, various such samples as shown in Table 2 were prepared while there were changes in the thickness T1 of the semiconductor oxide layer forming a part of the spacer layer in Table 1 as well as in the types of the additive metal (Me) contained in the semiconductor oxide layer (the main component ZnO).

In the reference examples, the semiconductor oxide layer forming a part of the spacer layer in Table 1 consists of ZnO alone, free from the given additive metal (Me) of the invention.

Each sample was prepared by forming the respective layers forming the CPP-GMR device into a multilayer structure, and then heat treating it at 250% for 3 hours. The heat treatment is mainly to put in order the direction of exchange coupling between the antiferromagnetic layer and the ferromagnetic layers and crystallize the semiconductor oxide layer thereby making its resistance low. Experimentation had taught that the preferable temperature range for the heat treatment is 200 to 350% to make ensure the CPP-GMR device has good characteristics.

The semiconductor oxide layers ((ZnO), (ZnO+Me)) forming a part of the spacer layer were formed as follows.

(i) The case where the semiconductor oxide layer is composed of ZnO alone as in the reference samples The ZnO layer was formed by sputtering using a ZnO target, because Zn could not be formed of its own right by sputtering.

After the respective layers were formed into the device, it was heat treated at 250% for 3 hours to crystallize the ZnO layer thereby making its resistance low.

The multilayer layer constituting the basics of such a device was processed into a columnar form that was in turn protected on the sides with an insulator to prepare a CPP-GMR device.

(ii) The case where the semiconductor oxide layer was set up in (ZnO+Me) form

A Me chip pasted or otherwise attached to a ZnO target was formed by sputtering. In an added state set out in Table 2, the resulting film was supposed to contain 1 metal at % of Me.

After the respective layers were formed into the device, it was heat treated at 250° C. for 3 hours to crystallize the (ZnO+Me) layer thereby making its resistance low.

The multilayer layer constituting the basics of such a device was processed into a columnar form that was in turn protected on the sides with an insulator to prepare a CPP-GMR device.

As viewed from above, each CPP-GMR device sample prepared in the aforesaid manner was of square shape of 0.2 μm in width and 0.2 μm in length.

Each of such CPP-GMR device samples was measured and estimated according to the following procedures about (1) the MR ratio, (2) the area resistivity AR ($\Omega \cdot m^2$) of the device, and (3) the head noise, respectively.

(1) MR Ratio

The MR ratio was measured by an ordinary dc four-terminal method. The MR ratio is represented by $\Delta R/R$ where $\Delta R$ is indicative of the amount of resistance change, and R is indicative of a resistance value. The figure, because of being small, is indicated in terms of percentage.

Note here that the MR ratio was found as an average of 100 samples.

(2) Area Resistivity AR ($\Omega \cdot m^2$) of the Device

The area resistivity was measured by a dc four-terminal method.

(3) Head Noise (μVrms/Hz)

Using a spectrum analyzer, this head noise was measured at a band of 1 kHz to 100 mHz or at 60 MHz.

A brief account is now given of the head noise.

The head noise is broken down into two noise components: Johnson noise (Vj) that is thermal noise and shot noise (Vs) that is quantum noise.

Johnson noise (V>) here is represented by equation (1):

$$\text{Johnson noise}(Vj) = (4K_B T \Delta f \cdot R)^{1/2} \quad (1)$$

where $K_B$ is a Boltzmann constant, T is a device temperature, $\Delta f$ is a band, and R is a resistance value.

The shot noise (Vs) is represented by equation (2):

$$\text{Shot noise}(Vs) = (2eI\Delta f)^{1/2} \cdot R \quad (2)$$

where e is an electron's charge, I is a current, $\Delta f$ is a band, and R is a resistance value.

Referring to the device structure shown in Table 1, wherein the semiconductor oxide layer is made of typically ZnO with its thickness set at 1.4 nm, i.e., a device structure of Ta (1.0)/Ru (2.0)/IrMn (5.0)/CoFe (3.0)/Ru (0.8)/CoFe (3.5)/Cu (0.7)/ZnO (1.4)/Cu (0.7)/CoFe (4.0)/Ru (2.0), the Johnson noise (Vj) and shot noise (Vs) were figured out of the device's resistance value, respectively, using the aforesaid equations (1) and (2).

Figure 8:
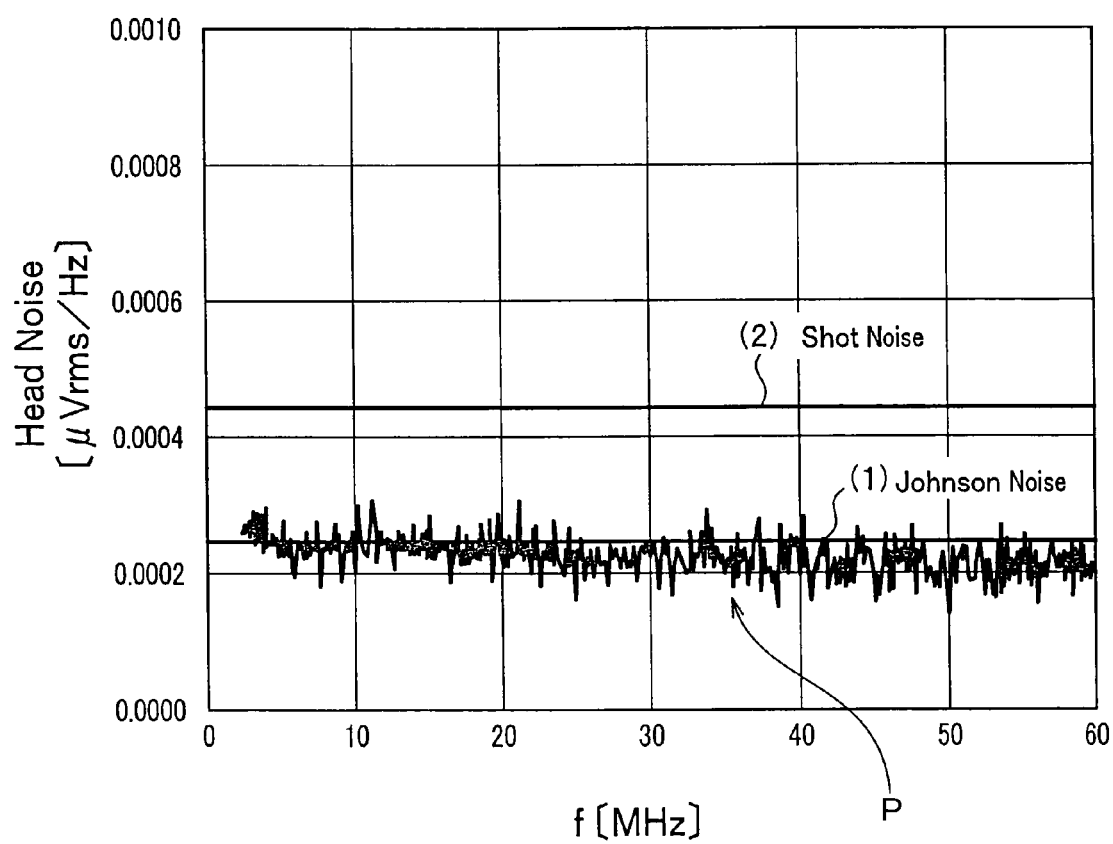
FIG. 8 is a graph indicative of head noise vs. frequency f (MHz).

The results are plotted in FIG. 8. In FIG. 8, line (1) is an estimated line value for Johnson noise (Vj) figured out of the resistance value of the device, using the aforesaid equation (1). Line (2) is an estimated line value for shot noise (Vs) figured out of the resistance value of the device, using the aforesaid equation (2). Referring to noise magnitude, shot noise (Vs) is larger than Johnson noise (Vj).

Referring to that device sample, the spectrum of an actually obtained head noise (indicated by a wave line P in FIG. 8) appears at a Johnson noise (Vj) position, as shown in FIG. 8. It follows that only Johnson noise comes out of this device sample yet with no shot noise. Johnson noise, because of being capable of ohmic conduction, tends to work overwhelmingly for the S/N value with a head.

Note here that in the case of tunnel conduction, the shot noise (Vs) prevails. For this reason, even when there is an increased MR ratio, the noise component grows large, working against the S/N.

The results of the aforesaid estimation are set out in Table 2.

TABLE 1

| Multilayer Structure | | Layer Material | Thickness (nm) |
|---|---|---|---|
| Protective Layer | | Ru | 2.0 |
| Free Layer | | $Co_{70}Fe_{30}$ | 4.0 |
| Spacer Layer | Second Nonmagnetic Metal Layer | Cu | 0.7 |
| | Semiconductor Oxide Layer | (Zno + Me) | T1 |
| | First Nonmagnetic Metal Layer | Cu | 0.7 |
| Fixed Magnetization Layer | Inner Layer | $Co_{70}Fe_{30}$ | 3.5 |
| | Nonmagnetic Intermediate Layer | Ru | 0.8 |
| | Outer Layer | $Co_{70}Fe_{30}$ | 3.0 |
| Antiferromagnetic Layer | | IrMn | 5.0 |
| Underlay Layer | | (Ta/Ru) | (1.0/2.0) |

TABLE 2

| Sample No. | Semiconductor Oxide Layer | | | MR Ratio (%) | Device's Area Resistivity AR ($\Omega \cdot \mu m^2$) | Head Noise ($\mu Vrms/Hz$) |
|---|---|---|---|---|---|---|
| | Type of the Metal | Amount of the Metal (at %) | Thickness T1 (nm) | | | |
| 1 (Comp.) | — | — | 0 | 3.3 | 0.05 | 0.000240 |
| 2 (Ref.) | — | — | 0.8 | 7.9 | 0.07 | 0.000244 |
| 3 (Ref.) | — | — | 1.0 | 10.0 | 0.10 | 0.000245 |
| 4 (Ref.) | — | — | 1.2 | 10.8 | 0.12 | 0.000244 |
| 5 (Ref.) | — | — | 1.6 | 14.0 | 0.20 | 0.000280 |
| 6 (Ref.) | — | — | 2.0 | 12.0 | 0.30 | 0.000300 |
| 7 (Ref.) | — | — | 2.2 | 10.0 | 0.35 | 0.000470 |
| 8 (Ref.) | — | — | 2.5 | 9.3 | 0.40 | 0.000500 |
| 9 (Ref.) | — | — | 3.0 | 7.1 | 0.53 | 0.000530 |
| 10 (Ref.) | — | — | 3.5 | 3.5 | 0.60 | 0.000550 |
| C-1 | Cu | 1.0 | 0.8 | 6.9 | 0.07 | 0.000243 |
| C-2 | Cu | 1.0 | 1.0 | 9.3 | 0.10 | 0.000244 |
| C-3 | Cu | 1.0 | 1.2 | 10.0 | 0.11 | 0.000246 |
| C-4 | Cu | 1.0 | 1.6 | 12.3 | 0.19 | 0.000276 |
| C-5 | Cu | 1.0 | 2.0 | 12.7 | 0.27 | 0.000292 |
| C-6 | Cu | 1.0 | 2.2 | 11.0 | 0.30 | 0.000300 |
| C-7 | Cu | 1.0 | 2.5 | 9.0 | 0.34 | 0.000310 |
| C-8 | Cu | 1.0 | 3.0 | 7.3 | 0.43 | 0.000530 |
| C-9 | Cu | 1.0 | 3.5 | 5.5 | 0.50 | 0.000550 |
| AG-1 | Ag | 1.0 | 0.8 | 6.6 | 0.06 | 0.000240 |
| AG-2 | Ag | 1.0 | 1.0 | 9.1 | 0.09 | 0.000243 |
| AG-3 | Ag | 1.0 | 1.2 | 9.7 | 0.11 | 0.000246 |
| AG-4 | Ag | 1.0 | 1.6 | 11.9 | 0.16 | 0.000270 |
| AG-5 | Ag | 1.0 | 2.0 | 13.4 | 0.27 | 0.000294 |
| AG-6 | Ag | 1.0 | 2.2 | 11.2 | 0.29 | 0.000299 |
| AG-7 | Ag | 1.0 | 2.5 | 9.3 | 0.33 | 0.000307 |
| AG-8 | Ag | 1.0 | 3.0 | 7.6 | 0.37 | 0.000480 |
| AG-9 | Ag | 1.0 | 3.5 | 5.5 | 0.44 | 0.000520 |
| P-1 | Pt | 1.0 | 0.8 | 6.9 | 0.10 | 0.000246 |
| P-2 | Pt | 1.0 | 1.0 | 8.8 | 0.14 | 0.000263 |
| P-3 | Pt | 1.0 | 1.2 | 10.0 | 0.16 | 0.000269 |
| P-4 | Pt | 1.0 | 1.6 | 12.3 | 0.22 | 0.000283 |
| P-5 | Pt | 1.0 | 2.0 | 12.8 | 0.25 | 0.000287 |
| P-6 | Pt | 1.0 | 2.2 | 11.0 | 0.31 | 0.000305 |
| P-7 | Pt | 1.0 | 2.5 | 8.5 | 0.35 | 0.000313 |
| P-8 | Pt | 1.0 | 3.0 | 6.1 | 0.43 | 0.000520 |
| P-9 | Pt | 1.0 | 3.5 | 3.5 | 0.54 | 0.000530 |
| AU-1 | Au | 1.0 | 0.8 | 6.5 | 0.07 | 0.000242 |
| AU-2 | Au | 1.0 | 1.0 | 8.9 | 0.11 | 0.000246 |
| AU-3 | Au | 1.0 | 1.2 | 9.6 | 0.12 | 0.000248 |
| AU-4 | Au | 1.0 | 1.6 | 12.0 | 0.20 | 0.000278 |
| AU-5 | Au | 1.0 | 2.0 | 12.1 | 0.27 | 0.000295 |
| AU-6 | Au | 1.0 | 2.2 | 10.7 | 0.31 | 0.000303 |
| AU-7 | Au | 1.0 | 2.5 | 8.7 | 0.35 | 0.000312 |
| AU-8 | Au | 1.0 | 3.0 | 6.8 | 0.44 | 0.000535 |
| AU-9 | Au | 1.0 | 3.5 | 5.0 | 0.51 | 0.000555 |
| S-1 | Sn | 1.0 | 0.8 | 7.2 | 0.07 | 0.000245 |
| S-2 | Sn | 1.0 | 1.0 | 9.3 | 0.10 | 0.000248 |
| S-3 | Sn | 1.0 | 1.2 | 10.4 | 0.12 | 0.000249 |
| S-4 | Sn | 1.0 | 1.6 | 12.6 | 0.19 | 0.000279 |
| S-5 | Sn | 1.0 | 2.0 | 14.0 | 0.22 | 0.000284 |
| S-6 | Sn | 1.0 | 2.2 | 11.8 | 0.30 | 0.000300 |
| S-7 | Sn | 1.0 | 2.5 | 9.5 | 0.35 | 0.000310 |
| S-8 | Sn | 1.0 | 3.0 | 7.5 | 0.44 | 0.000520 |
| S-9 | Sn | 1.0 | 3.5 | 5.5 | 0.51 | 0.000540 |

From the results set out in Table 2, the advantages of the invention would be undisputed.

That is, by using zinc oxide as the main component of the semiconductor oxide layer forming a part of the spacer layer and incorporating at least one selected from among Cu, Ag, Sn, Pt, and Au in that main component zinc oxide, it is possible to keep the device's area resistivity low as desired, and make the semiconductor oxide layer forming a part of the spacer layer thick while holding back any increase in the head noise (for instance, reduce the head noise down to 0.000350 μVram/Hz or lower).

By containing 1 metal at % of the additive metal of the invention, the thickness T1 of the semiconductor oxide layer of the invention can be increased up to T1=2.5 nm as compared with T1=2.0 mm in the reference example. The invention also takes aim at an MR ratio of 6.0% or greater.

It is noted that where there is a head noise of 0.0004 μVrms/Hz or grater, the shot noise (Vs) is supposed to have occurred.

Experimental Example II

Regarding the main component zinc oxide of the construction of the semiconductor oxide layer forming a part of the spacer layer, experimentation was carried out to learn what influences the Cu content had on the advantages of the invention.

The results are set out in Table 3 that again has data about the Cu content of 1.0 metal at % in the aforesaid Experimental Example I.

TABLE 3

Cu

| Sample No. | Semiconductor Oxide Layer | | | MR Ratio (%) | Device's Area Resistivity AR ($\Omega \cdot \mu m^2$) | Head Noise ($\mu Vrms/Hz$) |
|---|---|---|---|---|---|---|
| | Type of the Metal | Amount of the Metal (at %) | Thickness T1 (nm) | | | |
| C-1 | Cu | 1.0 | 0.8 | 6.9 | 0.07 | 0.000243 |
| C-2 | Cu | 1.0 | 1.0 | 9.3 | 0.10 | 0.000244 |
| C-3 | Cu | 1.0 | 1.2 | 10.0 | 0.11 | 0.000246 |
| C-4 | Cu | 1.0 | 1.6 | 12.3 | 0.19 | 0.000276 |
| C-5 | Cu | 1.0 | 2.0 | 12.7 | 0.27 | 0.000292 |
| C-6 | Cu | 1.0 | 2.2 | 11.0 | 0.30 | 0.000300 |
| C-7 | Cu | 1.0 | 2.5 | 9.0 | 0.34 | 0.000310 |
| C-8 | Cu | 1.0 | 3.0 | 7.3 | 0.43 | 0.000530 |
| C-9 | Cu | 1.0 | 3.5 | 5.5 | 0.50 | 0.000550 |
| C-10 | Cu | 3.0 | 0.8 | 6.5 | 0.06 | 0.000240 |
| C-11 | Cu | 3.0 | 1.0 | 8.6 | 0.08 | 0.000242 |
| C-12 | Cu | 3.0 | 1.2 | 9.3 | 0.10 | 0.000243 |
| C-13 | Cu | 3.0 | 1.6 | 10.5 | 0.14 | 0.000265 |
| C-14 | Cu | 3.0 | 2.0 | 12.7 | 0.25 | 0.000281 |
| C-15 | Cu | 3.0 | 2.2 | 11.0 | 0.27 | 0.000293 |
| C-16 | Cu | 3.0 | 2.5 | 9.5 | 0.30 | 0.000299 |
| C-17 | Cu | 3.0 | 3.0 | 8.1 | 0.33 | 0.000306 |
| C-18 | Cu | 3.0 | 3.5 | 5.6 | 0.38 | 0.000520 |
| C-19 | Cu | 5.0 | 0.8 | 6.0 | 0.05 | 0.000243 |
| C-20 | Cu | 5.0 | 1.0 | 7.7 | 0.08 | 0.000244 |
| C-21 | Cu | 5.0 | 1.2 | 8.8 | 0.09 | 0.000243 |
| C-22 | Cu | 5.0 | 1.6 | 10.1 | 0.13 | 0.000260 |
| C-23 | Cu | 5.0 | 2.0 | 11.4 | 0.22 | 0.000280 |
| C-24 | Cu | 5.0 | 2.2 | 11.0 | 0.24 | 0.000292 |
| C-25 | Cu | 5.0 | 2.5 | 9.5 | 0.27 | 0.000300 |
| C-26 | Cu | 5.0 | 3.0 | 8.1 | 0.31 | 0.000310 |
| C-27 | Cu | 5.0 | 3.5 | 6.1 | 0.35 | 0.000315 |
| C-28 | Cu | 8.0 | 0.8 | 5.0 | 0.05 | 0.000237 |
| C-29 | Cu | 8.0 | 1.0 | 5.9 | 0.07 | 0.000242 |
| C-30 | Cu | 8.0 | 1.2 | 6.9 | 0.09 | 0.000243 |
| C-31 | Cu | 8.0 | 1.6 | 8.3 | 0.12 | 0.000251 |
| C-32 | Cu | 8.0 | 2.0 | 10.8 | 0.20 | 0.000265 |
| C-33 | Cu | 8.0 | 2.2 | 9.9 | 0.23 | 0.000273 |
| C-34 | Cu | 8.0 | 2.5 | 8.8 | 0.26 | 0.000280 |
| C-35 | Cu | 8.0 | 3.0 | 7.5 | 0.29 | 0.000287 |
| C-36 | Cu | 8.0 | 3.5 | 6.2 | 0.32 | 0.000293 |
| C-37 | Cu | 12.0 | 0.8 | 4.1 | 0.05 | 0.000237 |
| C-38 | Cu | 12.0 | 1.0 | 5.1 | 0.06 | 0.000242 |
| C-39 | Cu | 12.0 | 1.2 | 5.8 | 0.07 | 0.000243 |
| C-40 | Cu | 12.0 | 1.6 | 6.8 | 0.10 | 0.000240 |
| C-41 | Cu | 12.0 | 2.0 | 8.0 | 0.15 | 0.000260 |

TABLE 3-continued

Cu

| Sample No. | Semiconductor Oxide Layer | | | Device's | |
|---|---|---|---|---|---|
| | Type of the Metal | Amount of the Metal (at %) | Thickness T1 (nm) | MR Ratio (%) | Area Resistivity AR ($\Omega \cdot \mu m^2$) | Head Noise ($\mu Vrms/Hz$) |

| Sample No. | Type of the Metal | Amount of the Metal (at %) | Thickness T1 (nm) | MR Ratio (%) | Area Resistivity AR ($\Omega \cdot \mu m^2$) | Head Noise ($\mu Vrms/Hz$) |
|---|---|---|---|---|---|---|
| C-42 | Cu | 12.0 | 2.2 | 7.4 | 0.20 | 0.000265 |
| C-43 | Cu | 12.0 | 2.5 | 6.5 | 0.22 | 0.000273 |
| C-44 | Cu | 12.0 | 3.0 | 5.6 | 0.24 | 0.000280 |
| C-45 | Cu | 12.0 | 3.5 | 4.9 | 0.27 | 0.000284 |

From the results set out in Table 3, it is found that when the content of Cu is in the range of 1.0 to 8.0 metal at %, the desired advantages of the invention have come about.

That is, when the content of Cu is 3.0 metal at % and 5.0 metal at %, the thickness T1 of the semiconductor oxide layer can be brought up to T1=3.0 nm. When the content of Cu is 8.0 metal at %, T1 can be brought up to T1=3.5 nm.

Experimental Example III

Regarding the main component zinc oxide of the construction of the semiconductor oxide layer forming a part of the spacer layer, experimentation was carried out to learn what influences the Ag content had on the advantages of the invention.

The results are set out in Table 4.

TABLE 4

Ag

| Sample No. | Type of the Metal | Amount of the Metal (at %) | Thickness T1 (nm) | MR Ratio (%) | Area Resistivity AR ($\Omega \cdot \mu m^2$) | Head Noise ($\mu Vrms/Hz$) |
|---|---|---|---|---|---|---|
| AG-1 | Ag | 1.0 | 0.8 | 6.6 | 0.06 | 0.000240 |
| AG-2 | Ag | 1.0 | 1.0 | 9.1 | 0.09 | 0.000243 |
| AG-3 | Ag | 1.0 | 1.2 | 9.7 | 0.11 | 0.000246 |
| AG-4 | Ag | 1.0 | 1.6 | 11.9 | 0.16 | 0.000270 |
| AG-5 | Ag | 1.0 | 2.0 | 13.4 | 0.27 | 0.000294 |
| AG-6 | Ag | 1.0 | 2.2 | 11.2 | 0.29 | 0.000299 |
| AG-7 | Ag | 1.0 | 2.5 | 9.3 | 0.33 | 0.000307 |
| AG-8 | Ag | 1.0 | 3.0 | 7.6 | 0.37 | 0.000480 |
| AG-9 | Ag | 1.0 | 3.5 | 5.5 | 0.44 | 0.000520 |
| AG-10 | Ag | 3.0 | 0.8 | 6.2 | 0.06 | 0.000238 |
| AG-11 | Ag | 3.0 | 1.0 | 8.3 | 0.09 | 0.000240 |
| AG-12 | Ag | 3.0 | 1.2 | 9.0 | 0.11 | 0.000241 |
| AG-13 | Ag | 3.0 | 1.6 | 10.9 | 0.15 | 0.000258 |
| AG-14 | Ag | 3.0 | 2.0 | 12.5 | 0.22 | 0.000278 |
| AG-15 | Ag | 3.0 | 2.2 | 11.4 | 0.27 | 0.000291 |
| AG-16 | Ag | 3.0 | 2.5 | 9.8 | 0.29 | 0.000300 |
| AG-17 | Ag | 3.0 | 3.0 | 7.9 | 0.33 | 0.000303 |
| AG-18 | Ag | 3.0 | 3.5 | 5.3 | 0.38 | 0.000470 |
| AG-19 | Ag | 5.0 | 0.8 | 5.8 | 0.05 | 0.000241 |
| AG-20 | Ag | 5.0 | 1.0 | 7.6 | 0.08 | 0.000242 |
| AG-21 | Ag | 5.0 | 1.2 | 8.5 | 0.10 | 0.000243 |
| AG-22 | Ag | 5.0 | 1.6 | 9.5 | 0.14 | 0.000257 |
| AG-23 | Ag | 5.0 | 2.0 | 10.4 | 0.19 | 0.000272 |
| AG-24 | Ag | 5.0 | 2.2 | 10.0 | 0.23 | 0.000288 |
| AG-25 | Ag | 5.0 | 2.5 | 9.1 | 0.26 | 0.000295 |
| AG-26 | Ag | 5.0 | 3.0 | 7.2 | 0.30 | 0.000303 |
| AG-27 | Ag | 5.0 | 3.5 | 5.1 | 0.35 | 0.000313 |
| AG-28 | Ag | 8.0 | 0.8 | 4.9 | 0.05 | 0.000243 |
| AG-29 | Ag | 8.0 | 1.0 | 5.9 | 0.08 | 0.000245 |
| AG-30 | Ag | 8.0 | 1.2 | 7.4 | 0.10 | 0.000243 |
| AG-31 | Ag | 8.0 | 1.6 | 9.0 | 0.13 | 0.000260 |
| AG-32 | Ag | 8.0 | 2.0 | 9.4 | 0.20 | 0.000277 |
| AG-33 | Ag | 8.0 | 2.2 | 8.7 | 0.23 | 0.000281 |
| AG-34 | Ag | 8.0 | 2.5 | 7.6 | 0.26 | 0.000294 |
| AG-35 | Ag | 8.0 | 3.0 | 6.3 | 0.30 | 0.000310 |
| AG-36 | Ag | 8.0 | 3.5 | 4.7 | 0.35 | 0.000318 |
| AG-37 | Ag | 12.0 | 0.8 | 3.9 | 0.06 | 0.000246 |
| AG-38 | Ag | 12.0 | 1.0 | 4.9 | 0.09 | 0.000247 |
| AG-39 | Ag | 12.0 | 1.2 | 5.6 | 0.10 | 0.000246 |
| AG-40 | Ag | 12.0 | 1.6 | 6.9 | 0.15 | 0.000257 |
| AG-41 | Ag | 12.0 | 2.0 | 6.7 | 0.20 | 0.000280 |
| AG-42 | Ag | 12.0 | 2.2 | 6.1 | 0.24 | 0.000290 |
| AG-43 | Ag | 12.0 | 2.5 | 5.7 | 0.27 | 0.000306 |
| AG-44 | Ag | 12.0 | 3.0 | 4.9 | 0.30 | 0.000315 |
| AG-45 | Ag | 12.0 | 3.5 | 4.0 | 0.34 | 0.000320 |

From the results set out in Table 4, it is found that when the content of Ag is in the range of 1.0 to 8.0 metal at %, the desired advantages of the invention have come about.

That is, when the content of Ag is 3.0 metal at % to 8.0 metal at %, the thickness T1 of the semiconductor oxide layer can be brought up to T1=3.0 nm.

Experimental Example IV

Regarding the main component zinc oxide in the construction of the semiconductor oxide layer forming a part of the spacer layer, experimentation was carried out to learn what influences the content of Pt, Au, and Sn had on the advantages of the invention.

As a result, when the content of Pt, Au, and Sn is in the range of 1.0 to 8.0 metal at % as in the aforesaid Experimental Examples II and III, it is found that the desired advantages of the invention have come about.

Experimental Example V

Experimentation was carried out to learn what influences the thickness $T_{11}$ of the first nonmagnetic metal layer and the thickness $T_{22}$ of the second non-magnetic metal layer had on the advantages of the invention.

CPP-GMR device samples of such multilayer structure as set out in Tables 5 and 6 were formed by sputtering and readied up for experimentation. Note here that specific sample preparation was done as described above. In the same sample No., the thickness $T_{11}$ of the first nonmagnetic metal layer was the same as the thickness $T_{22}$ of the second nonmagnetic metal layer.

The results of experimentation are set out in Table 6.

TABLE 5

| Multilayer Structure | | Layer Material | Thickness (nm) |
|---|---|---|---|
| Protective Layer | | Ru | 2.0 |
| Free Layer | | $Co_{70}Fe_{30}$ | 4.0 |
| Spacer Layer | Second Nonmagnetic Metal Layer | Cu | $T_{22}$ |
| | Semiconductor Oxide Layer | Zno + Cu (5.0at %) | 2.2 |
| | First Nonmagnetic Metal Layer | Cu | $T_{11}$ |
| Fixed Magnetization Layer | Inner Layer | $Co_{70}Fe_{30}$ | 3.5 |
| | Nonmagnetic Intermediate Layer | Ru | 0.8 |
| | Outer Layer | $Co_{70}Fe_{30}$ | 3.0 |
| Antiferromagnetic Layer | | IrMn | 5.0 |
| Underlay Layer | | (Ta/Ru) | (1.0/2.0) |

TABLE 6

| Sample No. | $T_{11}, T_{22}$ (nm) | Device's Area Resistivity AR ($\Omega \cdot \mu m^2$) | MR Ratio (%) |
|---|---|---|---|
| C-46 | 0.2 | 0.45 | 5.3 |
| C-47 | 0.3 | 0.31 | 11.8 |
| C-24 | 0.7 | 0.24 | 11.0 |
| C-48 | 2.0 | 0.22 | 7.1 |
| C-49 | 2.2 | 0.21 | 5.9 |
| C-50 | 2.5 | 0.20 | 4.8 |

The results set out in Table 6 teach that as the thicknesses $T_{11}$ and $T_{22}$ of the first and second non-magnetic metal layers are smaller than 0.3 nm, it causes the MR ratio to drop. A possible reason for this could be that as the $T_{11}$ and $T_{22}$ of the first and second nonmagnetic metal layers become too small, each one grows in an islands form rather than uninterruptedly with the result that there is a mixed metal-and-semiconductor state near the interface between the first and second nonmagnetic layers and the semiconductor oxide layer, in which case spin-polarized electrons are likely to scatter. As the thicknesses $T_{11}$ and $T_{22}$ of the first and second non-magnetic layers are by far greater than 2.0 nm, it again causes the MR ratio to drop. A possible reason for this could be that there is a noticeable scattering of spin-polarized electrons in the first and second nonmagnetic metal layers.

Such phenomena are also found in the event the first and second nonmagnetic metal layers are each made of a material other than Cu. The first and second nonmagnetic metal layers may have different thicknesses $T_{11}$ and $T_{22}$ as long as they are within the range of 0.3 to 2.0 nm. The preferable thicknesses $T_{11}$ and $T_{22}$ of the first and second nonmagnetic metal layers also hold true for other semiconductor oxide layers.

From the aforesaid results, the advantages of the invention would be undisputed.

That is, the invention provides a giant magneto-resistive effect device (CPP-GMR device) having a CPP (current perpendicular to plane) structure comprising a spacer layer, and a first ferromagnetic layer and a second ferromagnetic layer stacked one upon another with said spacer layer interposed between them, with a sense current applied in a stacking direction, wherein said free layer functions such that the direction of magnetization changes depending on an external magnetic field, said spacer layer comprises a first nonmagnetic metal layer and a second nonmagnetic metal layer, each made of a nonmagnetic metal material, and a semiconductor oxide layer interposed between said first nonmagnetic metal layer and said second nonmagnetic metal layer, said semiconductor oxide layer that forms a part of said spacer layer contains zinc oxide as its main component wherein said main component zinc oxide contains an additive metal, and said additive metal is less likely to be oxidized than zinc. It is thus possible to keep the area resistivity of the device low as desired, and make the semiconductor oxide layer forming a part of the spacer layer thick while holding back any noise increase. This makes sure the excellent advantages that any variation of the area resistivity of the device is inhibited while the S/N is prevented from getting worse, and the reliability of film characteristics is much more improved.

INDUSTRIAL APPLICABILITY

The invention may be applied to the field of a magnetic disk system comprising a magneto-resistive effect device for reading the magnetic field strength of a magnetic recording medium or the like as signals.

What we claim is:

1. A giant magneto-resistive effect device (CPP-GMR device) having a CPP (current perpendicular to plane) structure comprising a spacer layer, and a first ferromagnetic layer and a second ferromagnetic layer stacked one upon another with said spacer layer interposed between them, with a sense current applied in a stacking direction, wherein:

said spacer layer comprises a first nonmagnetic metal layer and a second nonmagnetic metal layer, each comprising a nonmagnetic metal material, and a semiconductor oxide layer interposed between said first nonmagnetic metal layer and said second nonmagnetic metal layer, said semiconductor oxide layer comprises zinc oxide as its main component and an additive metal, said additive metal is at least one metal selected from the group consisting of Ag, Pt, Au and Sn, and the content of said additive metal is 1.0 to 8.0 metal atomic %, and said semiconductor oxide layer has a thickness of 1.6 to 2.2 nm.

2. The magneto-resistive effect device according to claim 1, wherein the content of said additive metal is such that there is none of shot noise that is quantum noise and ohmic conduction is kept intact.

3. The magneto-resistive effect device according to claim 1, wherein said first non-magnetic metal layer and said second non-magnetic metal layer is at least one metal selected from the group consisting of Cu, Au, and Ag.

4. The magneto-resistive effect device according to claim 1, wherein said first non-magnetic metal layer and said second non-magnetic layer has a thickness of 0.3 to 2.0 nm.

5. The magneto-resistive effect device according to claim 1, which has an area resistivity of 0.1 to 0.3 $\Omega \cdot \mu m^2$.

6. The magneto-resistive effect device according to claim 1, wherein said spacer layer has an electro-conductivity of 133 to 432 S/cm.

7. The magneto-resistive effect device according to claim 1, wherein said second ferromagnetic layer is a free layer which functions such that a magnetization direction changes depending on an external magnetic field, and said first ferromagnetic layer is a fixed magnetization layer which has a magnetization direction fixed.

8. A thin-film magnetic head comprising:
a plane opposite to a recoding medium,
said magneto-resistive effect device according to claim 1, which is located near said medium opposite plane for detecting a signal magnetic field from said recording medium, and
a pair of electrodes for passing a current in the stacking direction of said magneto-resistive effect device.

9. A head gimbal assembly comprising:
a slider comprising said thin-film magnetic head according to claim 8 and located in opposition to said recording medium, and
a suspension adapted to resiliently support said slider.

10. A magnetic disk system comprising:
a slider comprising said thin-film magnetic head according to claim 8 and located in opposition to said recording medium, and
a positioning element adapted to support and position said slider with respect to said recording medium.

11. The magneto-resistive effect device according to claim 1, wherein said additive metal is Ag.

12. The magneto-resistive effect device according to claim 1, wherein said additive metal is Pt.

13. The magneto-resistive effect device according to claim 1, wherein said additive metal is Au.

14. The magneto-resistive effect device according to claim 1, wherein said additive metal is Sn.

15. The magneto-resistive effect device according to claim 1, wherein said additive metal is a mixture of Sn and at least one metal selected from the group consisting of Ag, Pt and Au.

* * * * *